US010388723B2

United States Patent
Wakimoto et al.

(10) Patent No.: US 10,388,723 B2
(45) Date of Patent: Aug. 20, 2019

(54) SEMICONDUCTOR DEVICE AND SEMICONDUCTOR DEVICE MANUFACTURING METHOD

(71) Applicant: FUJI ELECTRIC CO., LTD., Kanagawa (JP)

(72) Inventors: Hiroki Wakimoto, Matsumoto (JP); Yuichi Onozawa, Matsumoto (JP); Takahiro Tamura, Matsumoto (JP); Eri Ogawa, Aachen (DE)

(73) Assignee: FUJI ELECTRIC CO., LTD., Kanagawa (JP)

( * ) Notice: Subject to any disclaimer, the term of this patent is extended or adjusted under 35 U.S.C. 154(b) by 0 days.

(21) Appl. No.: 15/791,440

(22) Filed: Oct. 24, 2017

(65) Prior Publication Data

US 2018/0061935 A1 Mar. 1, 2018

Related U.S. Application Data

(63) Continuation of application No. PCT/JP2016/077759, filed on Sep. 20, 2016.

(30) Foreign Application Priority Data

Nov. 16, 2015 (JP) .................... 2015-224269

(51) Int. Cl.
*H01L 29/06* (2006.01)
*H01L 29/861* (2006.01)
(Continued)

(52) U.S. Cl.
CPC ........ *H01L 29/0615* (2013.01); *H01L 21/265* (2013.01); *H01L 21/26506* (2013.01);
(Continued)

(58) Field of Classification Search
CPC .................. H01L 21/76; H01L 21/761; H01L 29/06–0634; H01L 29/36; H01L 21/329;
(Continued)

(56) References Cited

U.S. PATENT DOCUMENTS

2005/0161746 A1 7/2005 Mauder et al.
2009/0267200 A1 10/2009 Gutt et al.
(Continued)

FOREIGN PATENT DOCUMENTS

WO 2014156849 10/2014

OTHER PUBLICATIONS

International Search Report for International Patent Application No. PCT/JP20161077759, issued by the Japan Patent Office dated Nov. 22, 2016.

*Primary Examiner* — Eric A. Ward
*Assistant Examiner* — Eric K Ashbahian

(57) ABSTRACT

To prevent an intermediate region from contacting a cathode electrode even if a cathode region is partially defective. There is provided a semiconductor device with a semiconductor substrate that has a field stop region where first impurities of a first conduction type are implanted, an intermediate region that is formed on a back surface side of the field stop region and where second impurities of a second conduction type are implanted, and a cathode region of the first conduction type that is formed on a back surface side of the intermediate region. In a back surface of the semiconductor substrate, a concentration of the first impurities is higher than a concentration of the second impurities.

15 Claims, 14 Drawing Sheets

(51) Int. Cl.

| | |
|---|---|
| *H01L 21/265* | (2006.01) |
| *H01L 21/324* | (2006.01) |
| *H01L 29/66* | (2006.01) |
| *H01L 29/32* | (2006.01) |
| *H01L 29/36* | (2006.01) |
| *H01L 29/87* | (2006.01) |
| H01L 29/167 | (2006.01) |

(52) U.S. Cl.
CPC ...... *H01L 21/26513* (2013.01); *H01L 21/324* (2013.01); *H01L 29/32* (2013.01); *H01L 29/36* (2013.01); *H01L 29/66121* (2013.01); *H01L 29/66136* (2013.01); *H01L 29/861* (2013.01); *H01L 29/87* (2013.01); *H01L 29/167* (2013.01)

(58) Field of Classification Search
CPC ............... H01L 29/868; H01L 29/0821; H01L 29/0826; H01L 29/7805; H01L 29/0878; H01L 29/861–885; H01L 29/0684; H01L 29/08
See application file for complete search history.

(56) References Cited

U.S. PATENT DOCUMENTS

| | | | |
|---|---|---|---|
| 2014/0327114 A1* | 11/2014 | Barthelmess | H01L 29/861 257/618 |
| 2015/0214347 A1 | 7/2015 | Falck et al. | |
| 2015/0364613 A1 | 12/2015 | Onozawa et al. | |
| 2016/0079235 A1* | 3/2016 | Matsudai | H01L 27/0727 257/140 |

* cited by examiner

200

200

SEMICONDUCTOR DEVICE AND SEMICONDUCTOR DEVICE MANUFACTURING METHOD

The contents of the following Japanese patent applications are incorporated herein by reference:
NO. 2015-224269 filed in JP on Nov. 16, 2015, and
NO. PCT/JP2016/077759 filed on Sep. 20, 2016.

BACKGROUND

1. Technical Field

The present invention relates to a semiconductor device and a semiconductor device manufacturing method.

2. Related Art

Conventionally, there has been a known structure in which a p-type intermediate region is formed in a manner to contact an n-type cathode region in a semiconductor device such as an FWD (free wheeling diode) in order to suppress current and/or voltage oscillations that may occur when minute current flows (for example, see Patent Document 1).
Patent Document 1: United States Patent Application Publication No. 2009/267200

However, if the cathode region becomes partially defective due to influence of particles or the like generated in a manufacturing process, the p-type intermediate region undesirably contacts a cathode electrode.

SUMMARY

A semiconductor device according to a first aspect of the present invention includes a semiconductor substrate. The semiconductor substrate may have a field stop region where first impurities of a first conduction type are implanted. The semiconductor substrate may have an intermediate region that is formed on a back surface side of the field stop region and where second impurities of a second conduction type are implanted. The semiconductor substrate may have a cathode region of the first conduction type that is formed on a back surface side of the intermediate region. In a back surface of the semiconductor substrate, a concentration of the first impurities may be higher than a concentration of the second impurities.

In the back surface of the semiconductor substrate, the concentration of the first impurities may be 5 times the concentration of the second impurities or higher. Third impurities are implanted in the cathode region, and in the back surface of the semiconductor substrate, the concentration of the first impurities may be one thousandth a concentration of the third impurities or lower.

A back surface region where the concentration of the first impurities is higher than the concentration of the second impurities is formed in a depth direction from the back surface of the semiconductor substrate, and a length of the back surface region in the depth direction may be a length through which a hole does not tunnel. A length of the back surface region in the depth direction may be longer than a Debye length in the back surface of the semiconductor substrate. The length of the back surface region in the depth direction may be 0.03 μm or longer.

The back surface region may be shorter than the cathode region in the depth direction. The back surface region may be longer than the cathode region in the depth direction. In the back surface region, a difference between the concentration of the first impurities and the concentration of the second impurities may increase in a region closer to the back surface of the semiconductor substrate.

A semiconductor device manufacturing method according to a second aspect of the present invention includes, in a semiconductor substrate, forming a field stop region where first impurities of a first conduction type are implanted, forming an intermediate region that is formed on a back surface side of the field stop region and where second impurities of a second conduction type are implanted, and forming a cathode region of the first conduction type that is formed on a back surface side of the intermediate region. In the back surface of the semiconductor substrate, the first impurities and the second impurities may be implanted such that a concentration of the first impurities becomes higher than a concentration of the second impurities.

Impurities may be implanted into the field stop region after impurities are implanted into the cathode region.

The summary clause does not necessarily describe all necessary features of the embodiments of the present invention. The present invention may also be a sub-combination of the features described above.

DESCRIPTION OF EXEMPLARY EMBODIMENTS

Hereinafter, the present invention is described through the embodiments of the invention. However, the following embodiments do not limit the invention according to the claims. Also, all the combinations of the features described in the embodiments are not necessarily essential for solving means of the invention.

Figure 1:
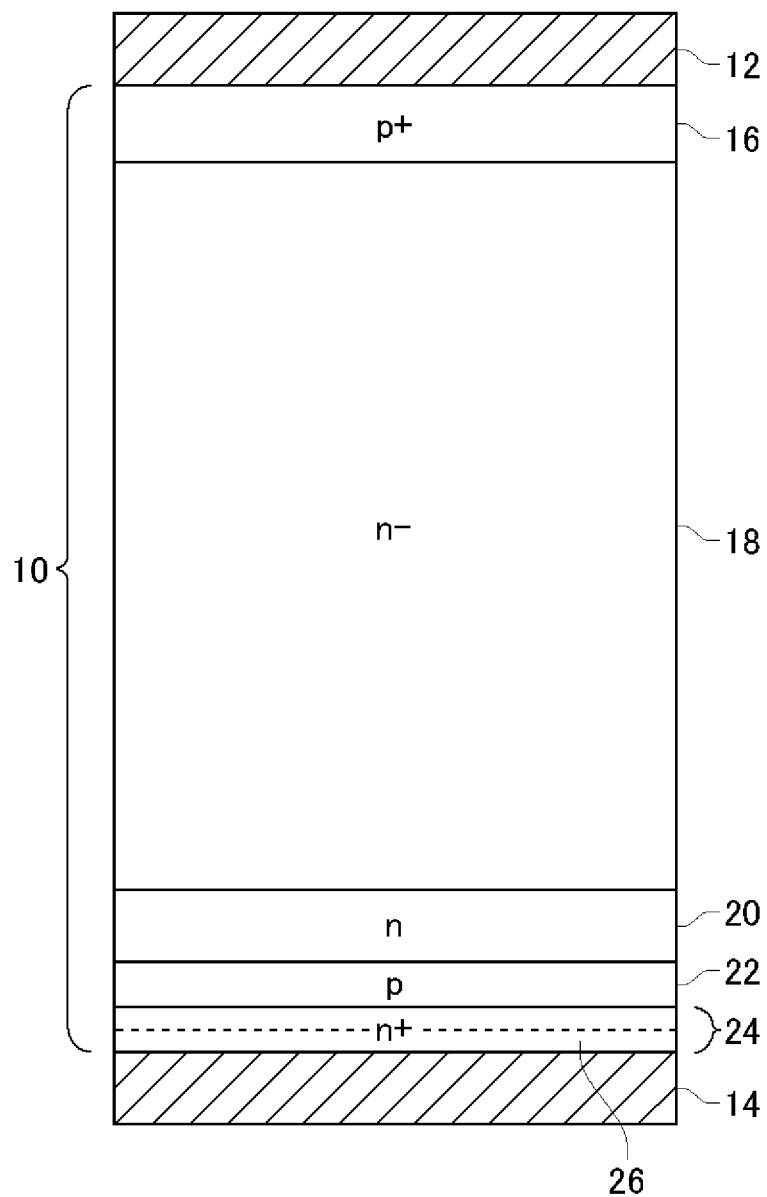
FIG. 1 is a diagram showing a cross section of a semiconductor device 100 according to an embodiment.

FIG. 1 is a diagram showing a cross section of a semiconductor device 100 according to an embodiment. The semiconductor device 100 is a vertical semiconductor device in which an electrode is formed on a front surface and a back surface of a semiconductor substrate 10 and current flows in the thickness direction of the semiconductor substrate 10. FIG. 1 shows a diode as an example of the semiconductor device 100. The diode may function as a free wheeling diode (FWD) provided in parallel with a switching element such as an IGBT.

The semiconductor device 100 includes the semiconductor substrate 10, an anode electrode 12 and a cathode electrode 14. The anode electrode 12 is provided to contact the front surface of the semiconductor substrate 10. The cathode electrode 14 is provided to contact the back surface of the semiconductor substrate 10. The anode electrode 12 and the cathode electrode 14 are formed of metal material containing aluminum, for example. The anode electrode 12 of the present example has a planar shape. However, the anode electrode 12 of another example may have a trench shape.

The semiconductor substrate 10 is formed of semiconductor material such as silicon or a chemical compound semiconductor. The semiconductor substrate 10 is doped with impurities at a predetermined concentration. Unless otherwise described, the impurities stated herein refer to dopants which are implanted into semiconductor material to indicate an n-type or p-type conduction type. The semiconductor substrate 10 of the present example has an n⁻-type conduction type. The n-type is an exemplary first conduction type. Also, the p-type is an exemplary second conduction type. However, the first conduction type and the second conduction type may each be an opposite conduction type.

The semiconductor substrate 10 has an anode region 16, a drift region 18, a field stop region (FS region 20), and a cathode region 24. Also, a back surface region 26 is provided in at least part of the cathode region 24.

The drift region 18 has the same conduction type as that of the semiconductor substrate 10. In the present example, a region where the anode region 16, the FS region 20, and the cathode region 24 are not formed in the semiconductor substrate 10 functions as the drift region 18.

The anode region 16 is formed in the semiconductor substrate 10 and on the front surface side of the semiconductor substrate 10 and electrically connected to the anode electrode 12. The anode region 16 is doped with impurities of a conduction type different from that of the drift region 18. In the present example, the anode region 16 is p-type.

The FS region 20 is formed on the back surface side of the drift region 18. The FS region 20 has the same conduction type as the drift region 18 and is where the impurities are implanted at a higher concentration than in the drift region 18. In the present example, the FS region 20 is n-type. Also, the impurities implanted in the FS region 20 are referred to as first impurities. The first impurities are, for example, hydrogen or phosphorus.

Hydrogen is attached to vacancies (V) and oxygen (O) in semiconductor material in the state of a cluster, which constitutes defect complexes (VOH defect). This VOH defect becomes a donor. Thus, the VOH defect becomes an n-type dopant (impurities). Hydrogen may be introduced into the semiconductor material by implantation of hydrogen ion such as protons and deuteron. Oxygen may be contained in semiconductor material in a manufacturing process or may be intendedly introduced into a region of a semiconductor in a process of manufacturing a semiconductor device. Vacancies may be contained in semiconductor material in a manufacturing process or may be intendedly introduced in a region of a semiconductor in a process of manufacturing a semiconductor device. Unless otherwise described, a donor containing hydrogen (VOH defect) is herein referred to simply as a hydrogen donor, and hydrogen is referred to as a dopant (impurities). By providing the FS region 20 at a high concentration, a depletion layer that extends from an interface of the anode region 16 can be prevented from reaching the intermediate region 22 or the cathode region 24.

The intermediate region 22 is formed on the back surface side of the FS region 20. The intermediate region 22 has the same conduction type as that of the anode region 16. In the present example, the intermediate region 22 is p-type. Also, the impurities implanted in the intermediate region 22 are referred to as second impurities. The second impurities are, for example, boron.

The cathode region 24 is formed on the back surface side of the intermediate region 22. The cathode region 24 has the same conduction type as that of the FS region 20. The impurity concentration in the cathode region 24 of the present example is higher than the impurity concentration in each of the FS region 20 and the intermediate region 22. In the present example, the cathode region 24 is n⁺-type. Also, the impurities implanted in the cathode region 24 are referred to as third impurities. The third impurities are, for example, phosphorus. The cathode region 24 is electrically connected to the cathode electrode 14.

There is a commonly known phenomenon in which if a diode is reversely recovered at a small current around one tenth a rated current, carriers on the cathode side are depleted, and then a current or voltage waveform severely oscillates. In the semiconductor device 100 of the present example, if a depletion layer expands from the anode side during the reverse recovery, and the carriers on the cathode side are about to be depleted, a high electric field is applied to a pn junction between the intermediate region 22 and the cathode region 24, so that avalanche breakdown occurs in the junction. Thus, holes are injected into the drift region 18 from the cathode side, so that the density of the carriers in the drift region 18 on the cathode side can be made higher. As a result, voltage and current oscillations due to depletion of the carriers can be suppressed. Therefore, soft recovery of the semiconductor device 100 can be achieved.

The first impurities having been implanted into the FS region 20 are diffused inside the semiconductor substrate 10 by thermal treatment or the like. As a result, the first impurities are present also inside the intermediate region 22 and the cathode region 24. Similarly, the second impurities having been implanted in the intermediate region 22 are also present inside the cathode region 24.

In the back surface of the semiconductor substrate 10 in the semiconductor device 100 of the present example, the concentration of the first impurities per unit volume is higher than the concentration of the second impurities per unit volume. In the semiconductor device 100 of the present example, the back surface region 26 where the concentration of the first impurities is higher than the concentration of the second impurities is formed in a depth direction from the back surface of the semiconductor substrate 10. A dotted line in FIG. 1 shows an end of the back surface region 26, the end facing the front surface of the semiconductor substrate 10. Note that the depth direction refers to a direction from the front surface to the back surface or a direction from the back surface to the front surface of the semiconductor substrate 10.

If part of the cathode region 24 is defective in a device in which the back surface region 26 is not provided, the intermediate region 22 appears in the defective region. Because of this, the intermediate region 22 undesirably contacts the cathode electrode 14. In contrast, in the semiconductor device 100, even if part of the cathode region 24 is defective, the n-type back surface region 26 appears in a portion of the defective region, the portion contacting the cathode electrode 14. Because of this, even if part of the cathode region 24 is defective, the intermediate region 22 can be prevented from being electrically connected to the cathode electrode 14.

Figure 2:
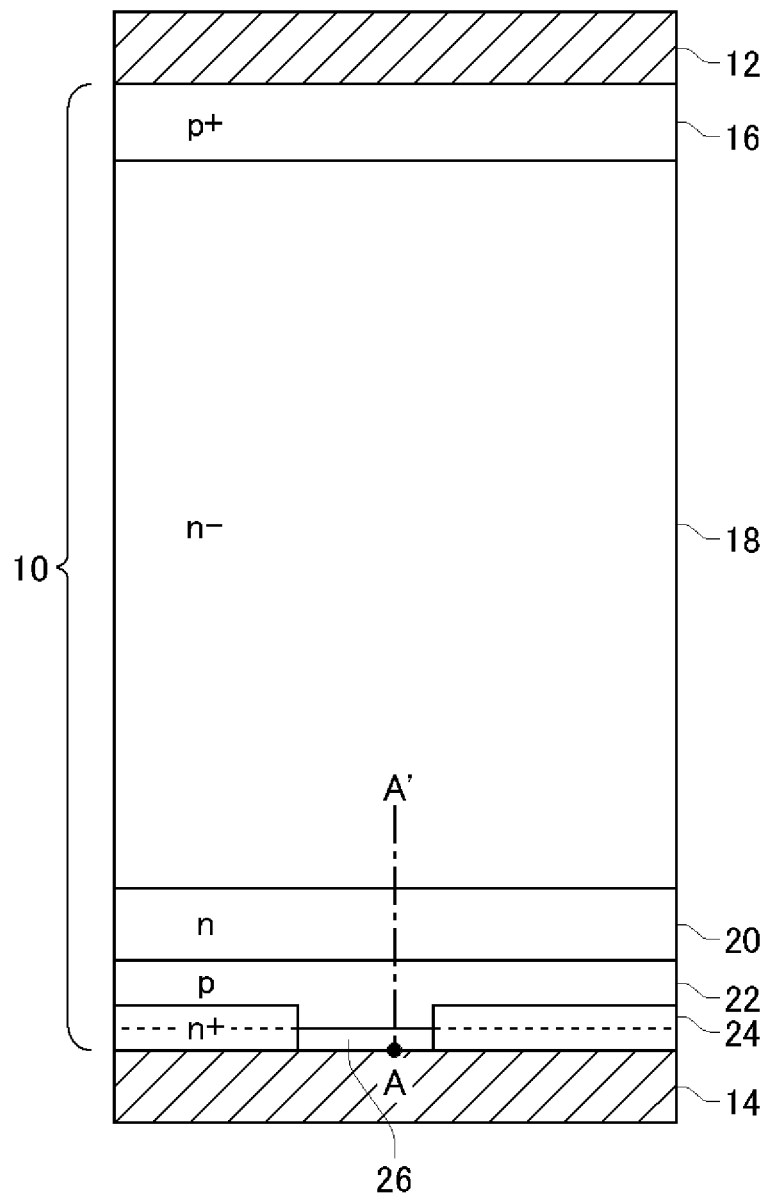
FIG. 2 is a diagram showing the semiconductor device 100 in which part of a cathode region 24 is defective.

FIG. 2 is a diagram showing the semiconductor device 100 in which part of the cathode region 24 is defective. For example, if particles such as dust are attached to the back surface of the semiconductor substrate 10 in a step in which n-type impurities are implanted from the back surface of the semiconductor substrate 10 into the cathode region 24, the impurities are not implanted into a region covered with the particles. In this case, the cathode region 24 is not formed in the region, and thus, a defective part is undesirably generated.

As described above, in a case where the back surface region 26 is not provided, the intermediate region 22 appears in the defective region in the cathode region 24. In this case, the intermediate region 22 undesirably contacts the cathode electrode 14. As a result, the intermediate region 22 and the cathode region 24 undesirably have the same potential. If the intermediate region 22 and the cathode region 24 have the same potential, it becomes more difficult for holes to be injected from the intermediate region 22 into the cathode region 24 when a forward bias is applied, so that the forward voltage is undesirably increases.

In contrast, by providing the back surface region 26 in the semiconductor device 100, the n-type back surface region 26 appears in the defective region in the cathode region 24. Because of this, even if part of the cathode region 24 is defective, the intermediate region 22 and the cathode region 24 can be prevented from having the same potential, so that the semiconductor device 100 can be properly operated.

Figure 3:
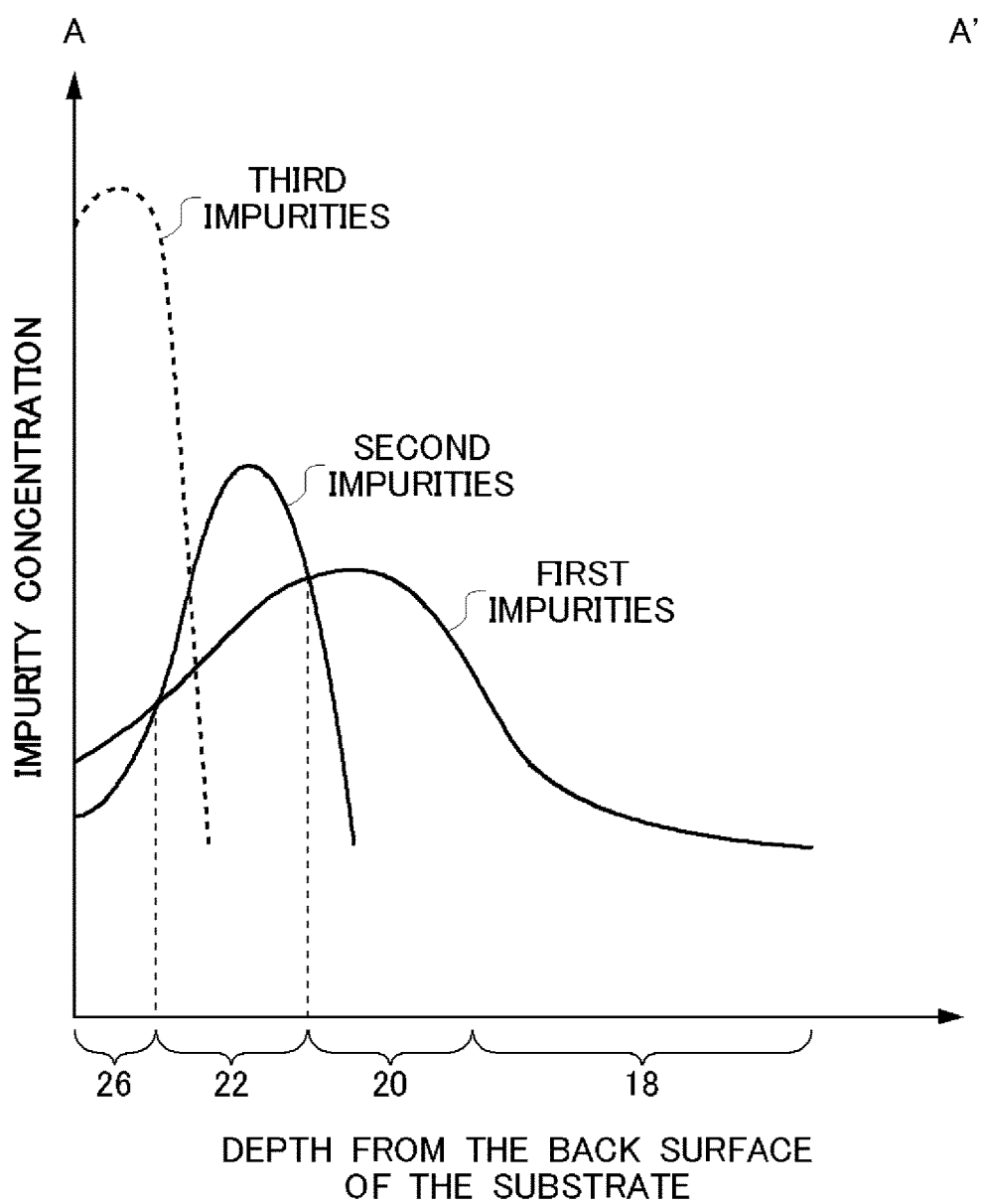
FIG. 3 is a graph showing distributions of impurity concentrations in A-A' portion shown in FIG. 2.

FIG. 3 is a graph showing distributions of impurity concentrations in A-A' portion in FIG. 2. In FIG. 3, the vertical axis is a logarithmic axis showing the impurity concentrations. In FIG. 3, the horizontal axis shows depths from the back surface of the semiconductor substrate 10. Also, corresponding to the horizontal axis, respective ranges of the back surface region 26, the intermediate region 22, the FS region 20, and the drift region 18 are shown. Note that because the cathode region 24 is defective in the A-A' portion, the cathode region 24 is not shown. In the nondefective part of the cathode region 24, a region where the concentration of the third impurities is higher than the concentration of the second impurities corresponds to the cathode region 24.

Note that solid lines in FIG. 3 respectively show the concentration distribution of the first impurities implanted and diffused in the FS region 20 and the concentration distribution of the second impurities implanted and diffused in the intermediate region 22. Also, a dotted line shows the concentration distribution of the third impurities in a case where the cathode region 24 is not defective. Note that even in a case where the first impurities and the third impurities are impurities of the same kind, the concentrations of the first and the third impurities are herein respectively defined, with the first impurities and the third impurities regarded as distinct impurities.

In the FS region 20, the first impurities such as hydrogen are implanted and diffused. Because of this, a peak concentration of the first impurities is present in the FS region 20. In the intermediate region 22, the second impurities such as boron are implanted and diffused. A p-type region where the concentration of the second impurities is higher than the concentration of the first impurities corresponds to the intermediate region 22.

As described above, in the vicinity of the back surface of the semiconductor substrate 10, the n-type back surface region 26 where the concentration of the first impurities is higher than the concentration of the second impurities is formed. Because of this, the p-type intermediate region 22 can be prevented from contacting the cathode electrode 14.

Figure 4:
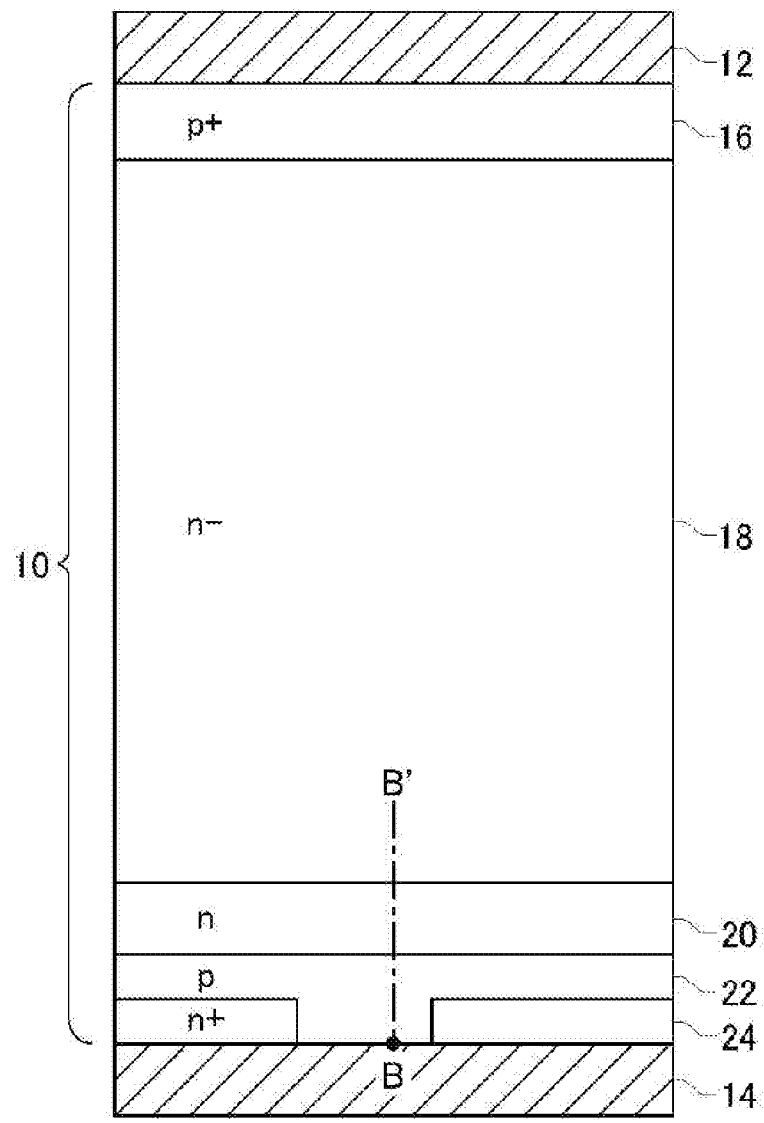
FIG. 4 is a diagram showing a cross section of a semiconductor device 200 according to a comparative example.

FIG. 4 is a diagram showing a cross section of a semiconductor device 200 according to a comparative example. In the semiconductor device 200, concentration distributions of the first impurities and the second impurities are different from those in the semiconductor device 100. In the vicinity of the back surface of the semiconductor substrate 10, the semiconductor device 200 does not have the back surface region 26 where the concentration of the first impurities becomes higher than the concentration of the second impurities. The remaining structure of the semiconductor device 200 is the same as that of the semiconductor device 100. Note that FIG. 4 shows the semiconductor device 200 in which part of the cathode region 24 is defective.

Figure 5:
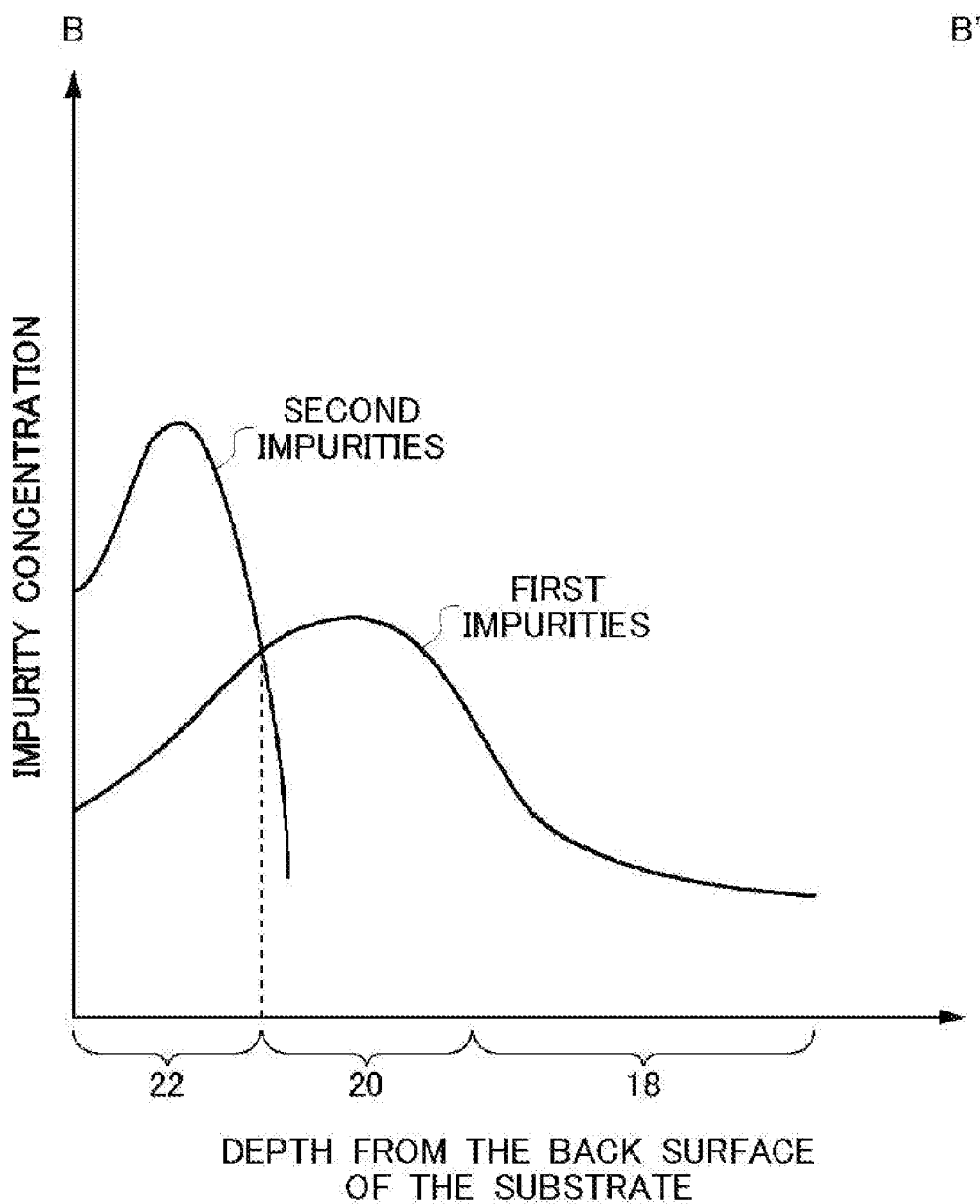
FIG. 5 is a graph showing distributions of impurity concentrations in B-B' portion shown in FIG. 4.

FIG. 5 is a graph showing distributions of impurity concentrations in B-B' portion in FIG. 4. The B-B' portion is a portion where the cathode region 24 is defective. Note that FIG. 5 shows the concentration of the first impurities and the concentration of the second impurities and omits the concentration of the third impurities. The concentration distribution of the third impurities is the same as the concentration distribution of the third impurities shown in FIG. 3.

In the semiconductor device 200, the concentration of the second impurities is higher than the concentration of the first impurities also in the vicinity of the back surface of the semiconductor substrate 10. Because of this, the back surface region 26 is not formed, so that the intermediate region 22 undesirably contacts the cathode electrode 14.

Figure 6A:
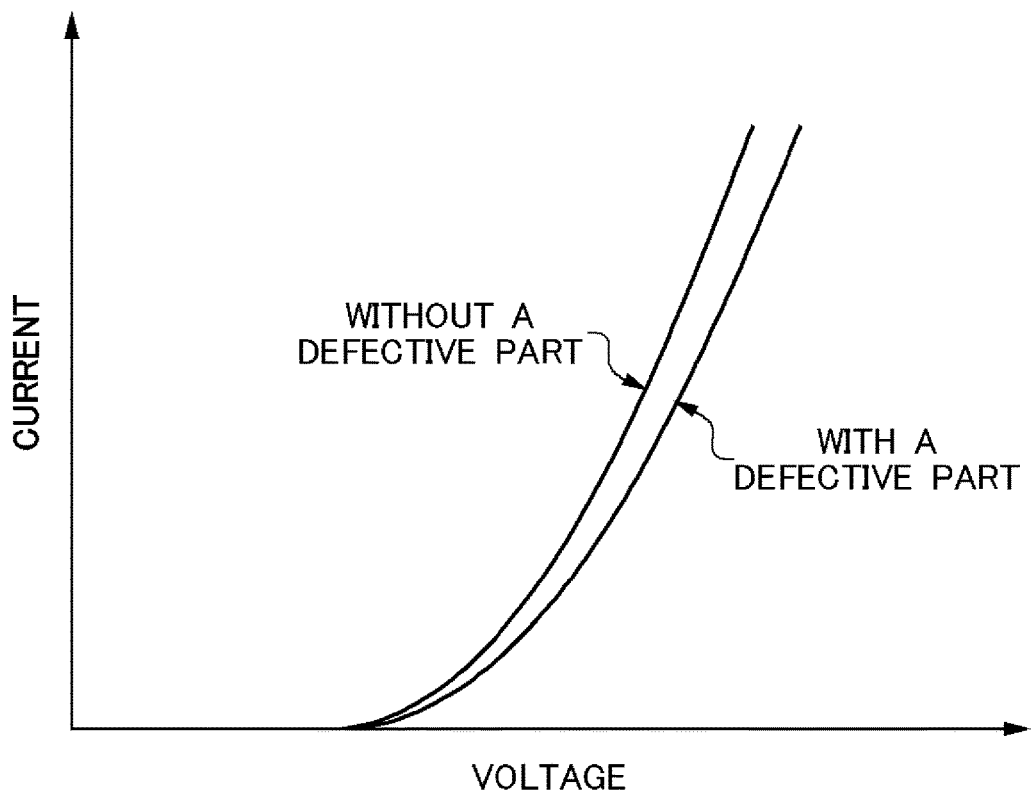
FIG. 6A is a graph showing a relation between forward voltage applied to the semiconductor device 100 and current flowing through the semiconductor device 100.

FIG. 6A is a graph showing a relation between forward voltage applied to the semiconductor device 100 and current flowing through the semiconductor device 100. Also, FIG. 6A shows a case where the cathode region 24 has no defective parts and a case where a defective part is generated in the cathode region 24. In the present example, the width of the defective part in the cathode region 24 is 3.0 µm in a direction parallel to the back surface of the semiconductor substrate 10. As shown in FIG. 6A, in the semiconductor device 100 having the back surface region 26, even if a defective part is generated in the cathode region 24, the forward voltage hardly increases.

Figure 6B:
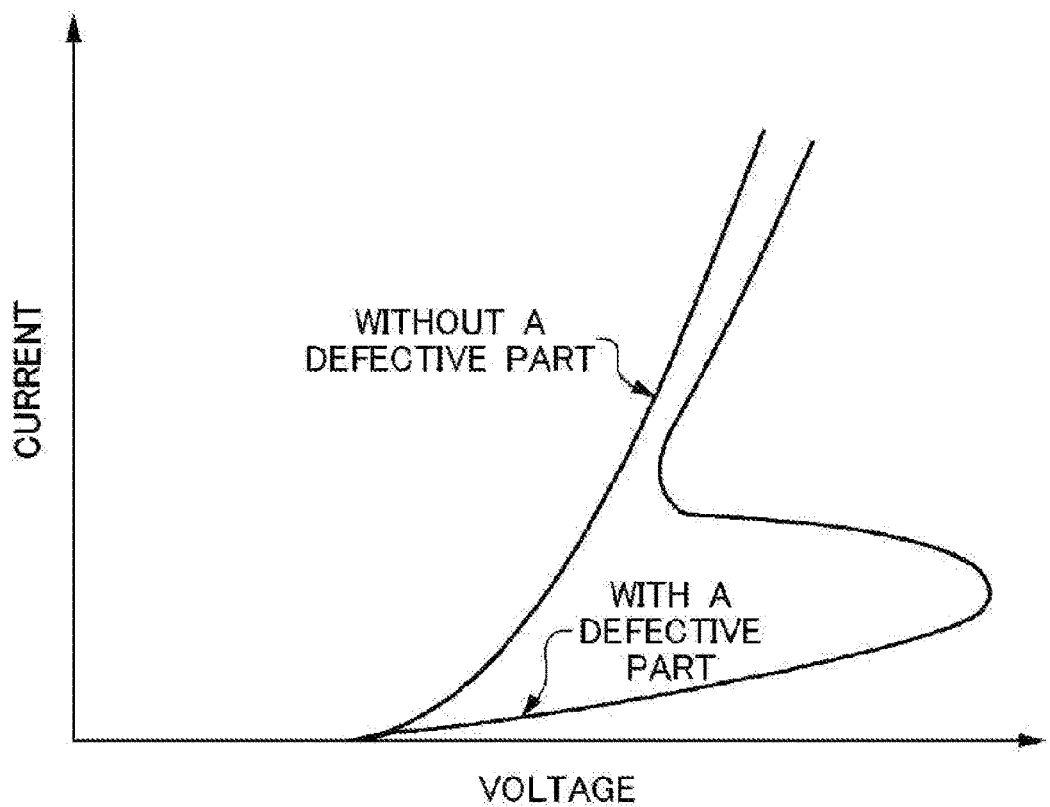
FIG. 6B is a graph showing a relation between forward voltage applied to the semiconductor device 200 and current flowing through the semiconductor device 200.

FIG. 6B is a graph showing a relation between forward voltage applied to the semiconductor device 200 and current flowing through the semiconductor device 200. Also, FIG. 6B shows a case where the cathode region 24 has no defective parts and a case where a defective part is generated in the cathode region 24. In the present example, the width of the defective part in the cathode region 24 is 3.0 µm. Note that even when the width of the defective part was varied to be 0.1 µm, 0.3 µm, and 1.0 µm, the results were the same as that in the case where the width of the defective part was 3.0 µm.

In the semiconductor device 200 having no back surface regions 26 as shown in FIG. 6B, if a defective part is generated even slightly in the cathode region 24, the forward voltage undesirably becomes substantially large. This is considered to be because the intermediate region 22 contacts the cathode electrode 14 to undesirably have the same potential as that of the cathode region 24, and then electrons are prevented from being injected from the cathode region 24 into the intermediate region 22 when a forward bias is applied. Further increase in the forward bias voltage leads to a so-called snap-back waveform. The waveform indicates a negative resistance and a rapid increase of current.

Figure 7:
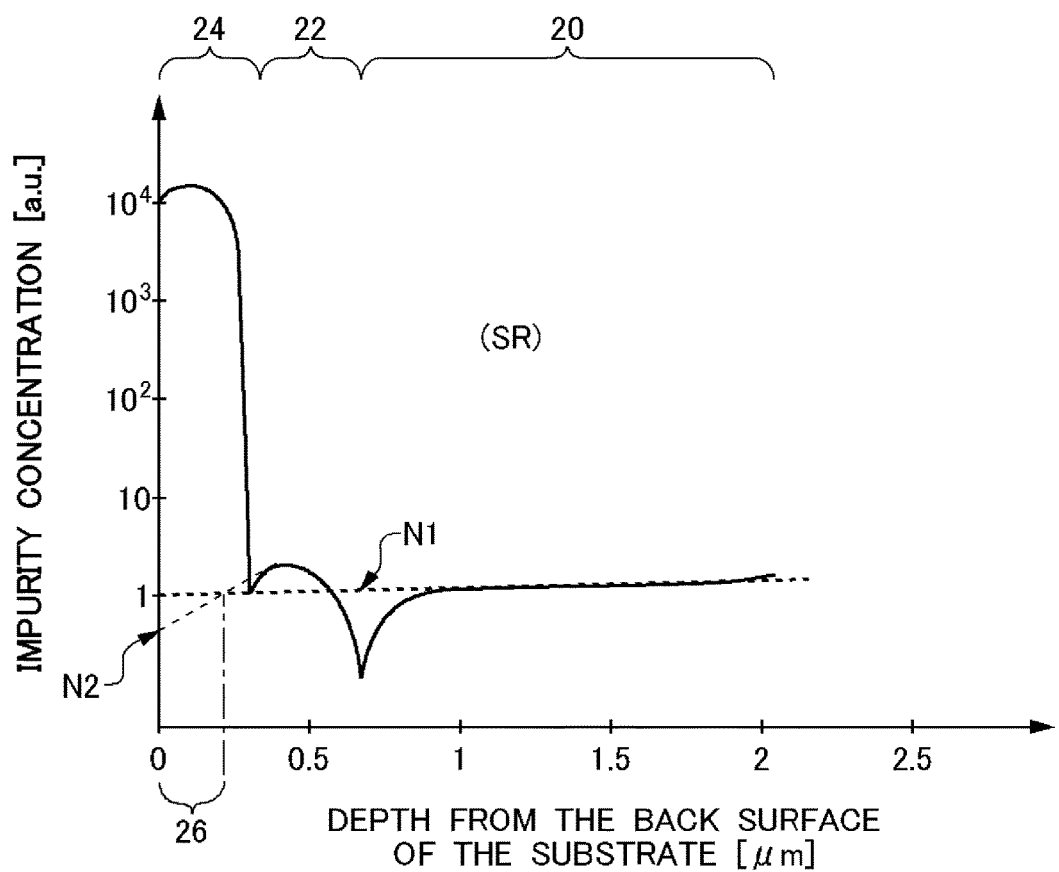
FIG. 7 is a graph showing an exemplary impurity concentration distribution in the cathode region 24, an intermediate region 22 and an FS region 20.

FIG. 7 is a graph showing an exemplary impurity concentration distribution in the cathode region 24, the intermediate region 22, and the FS region 20. The impurity concentration distribution in FIG. 7 shows a result of measurement using SR (spreading resistance) method. The vertical axis in FIG. 7 is a logarithmic axis (for example, a common logarithm) showing relative values of the impurity concentration, and the horizontal axis shows the distances from the back surface of the semiconductor substrate 10. The impurity concentration shown in a solid line in FIG. 7 shows a net impurity concentration (net doping concentration) as the outcome of combining the concentrations of the first impurities, the second impurities, and the third impurities. That is, in a region that contains a plurality of impurities of the same conduction type, the solid line indicates the total of the concentrations of the respective impurities. In a region that contains a plurality of impurities of different conduction types, the solid line indicates a difference between the concentrations of the impurities of the different conduction types. Also, the boundary between the regions of different conduction types forms a pn junction where the charge density of the p-type impurities and the n-type impurities is compensated, which decreases the net doping concentration. Thus, as shown in FIG. 7, a drop (local minimum value) in the concentration is observed at the pn junction in some cases.

The concentration of the first impurities in the back surface of the semiconductor substrate 10 can be estimated from the impurity concentration distribution measured by SR method. For example, the impurity concentration distribution in the FS region 20 shows approximately the concentration distribution of the first impurities. As an example, the concentration distribution of the first impurities in the FS region 20 may be extrapolated to the back surface side of the semiconductor substrate 10 to estimate the concentration of the first impurities in the back surface of the semiconductor substrate 10. As a more specific example, based on the impurity concentration distribution measured by SR method, the boundary (pn junction) between the FS region 20 and the intermediate region 22 is detected. The boundary is a point where the conduction type of the impurity concentration distribution detected by SR method is inverted. Also, the boundary may be a point where the measured impurity concentration distribution shows the local minimum value.

Then, a range where the impurity concentration distribution initially becomes linear in a region (FS region 20) that is deeper than the boundary is detected. As an example, the range may be from a position that is 0.5 μm deeper than the boundary (the depth from the back surface of the substrate is 1.0 μm) to a position that is 1.5 μm deeper than the boundary (the depth from the back surface of the substrate is 2.0 μm). The distance from the boundary is preferably longer than the diffusion distance of the second impurities. The impurity concentration distribution in the range is linearly approximated by the least-squares method. Note that the least-squares method may be used for fitting with values on the vertical axis as logarithmic values (for example, common logarithm) and with values on the horizontal axis as linear values or may be used for fitting with values on the vertical axis as linear values and with values on the horizontal axis also as linear values. For example, log y=ax+b may be applied in a case where linear approximation is obtained with the vertical axis as common logarithm value. The symbol x indicates a depth from the back surface of the substrate, and the symbol y indicates a measured value of the impurity concentration in x. The straight line of the linear approximation is extrapolated to the position of the back surface of the semiconductor substrate 10 to estimate the concentration of the first impurities in the back surface of the semiconductor substrate 10. In FIG. 7, the straight line is shown in a dotted line as a concentration N1.

In FIG. 7, the concentration of the first impurities in the back surface of the semiconductor substrate 10 is normalized as a reference value 1. Note that the concentration of the third impurities is greatly higher than the concentration of the other impurities, and therefore, the impurity concentration in the back surface of the semiconductor substrate 10 measured by SR method corresponds to the concentration of the third impurities. In the back surface of the semiconductor substrate 10, the concentration of the first impurities may be one thousandth the concentration of the third impurities or lower. Also, fitting may be performed with a measured value that is not normalized.

Note that the concentration of the second impurities in the back surface of the semiconductor substrate 10 is indicated as N2. As described above, in the back surface of the semiconductor substrate 10, the concentration N2 of the second impurities is lower than the concentration of the first impurities. The concentration of the second impurities may be measured by a method other than SR method.

Figure 8:
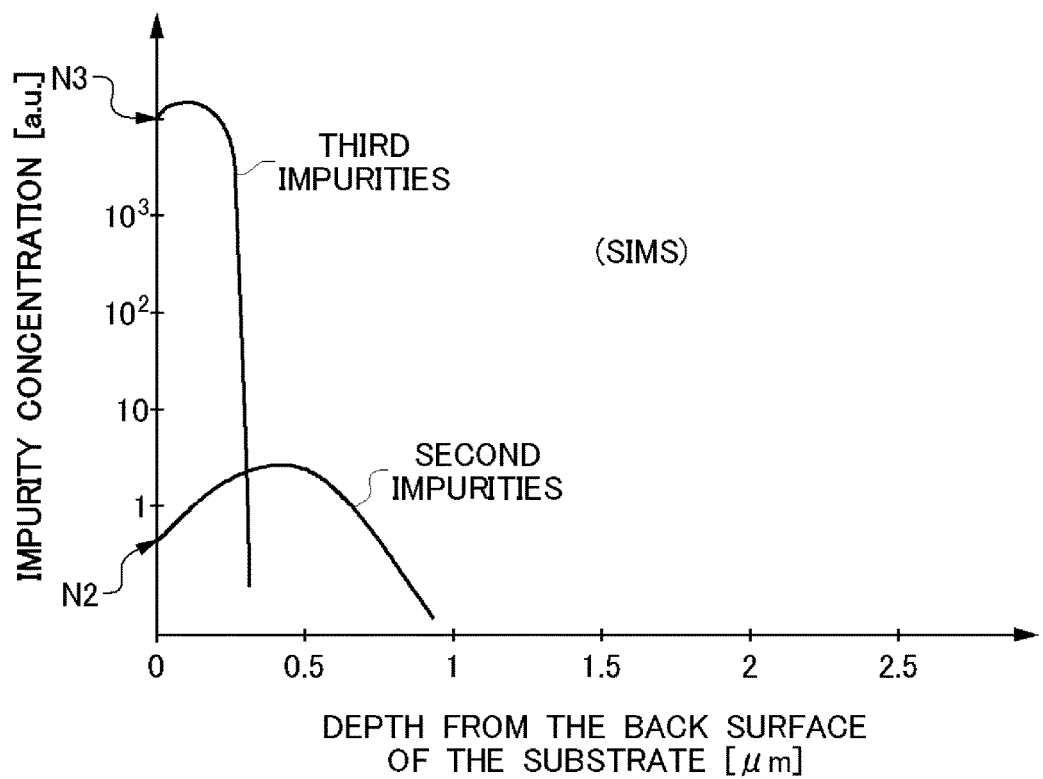
FIG. 8 is a graph showing exemplary concentrations of second impurities and third impurities measured by SIMS (secondary ion mass spectrometry).

FIG. 8 is a graph showing exemplary concentrations of the second and the third impurities measured by SIMS (secondary ion mass spectrometry). The concentration of the second impurities such as boron in the back surface of the semiconductor substrate 10 can be precisely measured by SIMS. Also, in a case where the first impurities are impurities such as phosphorus that can be precisely measured by SIMS, the concentration of the first impurities may also be measured by SIMS. Note that in FIG. 7, part of the concentration distribution of the second impurities measured by SIMS is shown in a dotted line. Also, the concentration distribution of the third impurities shown in FIG. 8 is approximately equal to the impurity concentration distribution in the cathode region 24 shown in FIG. 7.

As shown in FIG. 7 and FIG. 8, the concentration distributions of the first impurities and the second impurities can be measured by using SR method and SIMS. Also, the concentration of the first impurities measured by SR method and the concentration of the second impurities measured by SIMS may be corrected according to the difference between the concentration of the third impurities measured by SR method and the concentration of the third impurities measured by SIMS. By such methods, whether the back surface region 26 is present in the vicinity of the back surface of the semiconductor substrate 10 can be determined. The back surface region 26 may be a region reaching the back surface of the substrate from the intersection of the concentration distribution N1 of the first impurities, which was estimated by the least-squares method based on a value measured by SR method, and the concentration distribution N2 of the second impurities, which was measured by SIMS. Also, the length of the back surface region 26 in the depth direction can be measured.

In the back surface of the semiconductor substrate 10, the concentration of the first impurities may be 5 times the concentration of the second impurities or higher. The concentration of the first impurities may be 10 times the concentration of the second impurities or higher. It may also be 20 times the concentration of the second impurities or higher. Higher concentration of the first impurities can prevent the intermediate region 22 more certainly from contacting the cathode electrode 14. Note that in the back surface region 26, the difference between the concentration of the first impurities and the concentration of the second impurities may increase in a region closer to the back surface of the semiconductor substrate 10.

Note that the length of the back surface region 26 in the depth direction is preferably a length through which holes do not tunnel. This can prevent holes from tunneling from the intermediate region 22 to the cathode electrode 14 even in a case where the cathode region 24 is partially defective.

Also, the length of the back surface region 26 in the depth direction is preferably longer than the Debye length that corresponds to the concentration of the first impurities in the back surface of the semiconductor substrate. The Debye length $\lambda_D$ can be obtained, for example, by the following formula.

$$\lambda_D = (\varepsilon_O \varepsilon_r kT/N_D q^2)^{1/2}$$

Here, $\varepsilon_O$ indicates the permittivity of a vacuum, $\varepsilon_r$ indicates the relative permittivity of a semiconductor, k indicates a Boltzmann constant, T indicates a temperature, $N_D$ indicates an impurity concentration, and q indicates an elementary charge. Although $N_D$ indicates a concentration of the electrons supplied from an n-type dopant, it herein simply indicates an impurity concentration (donor concentration). A Debye length that corresponds to the concentration of the first impurities in the back surface of the semiconductor substrate 10 and is in the room temperature (300K) is simply referred to as the Debye length in the back surface of the semiconductor substrate 10.

The Debye length is considered to be a value that indicates whether the inside of the charge plasma can be regarded as charge neutral. That is, if the size (length) of the charge plasma is sufficiently longer than the Debye length, Coulomb force is shielded at the boundary of the charge plasma. In the semiconductor device 100, electrons and holes that flow in an ON-state correspond to charge plasma.

Because of this, if the back surface region 26 is longer than the Debye length in the back surface of the semiconductor substrate 10, holes that flow from the anode electrode 12 to the cathode electrode 14 at forward bias can be shielded even in a case where part of the cathode region 24 is defective. The length of the back surface region 26 may be twice the Debye length in the back surface of the semiconductor substrate 10 or longer. It may also be 10 times the Debye length or longer.

Figure 9:
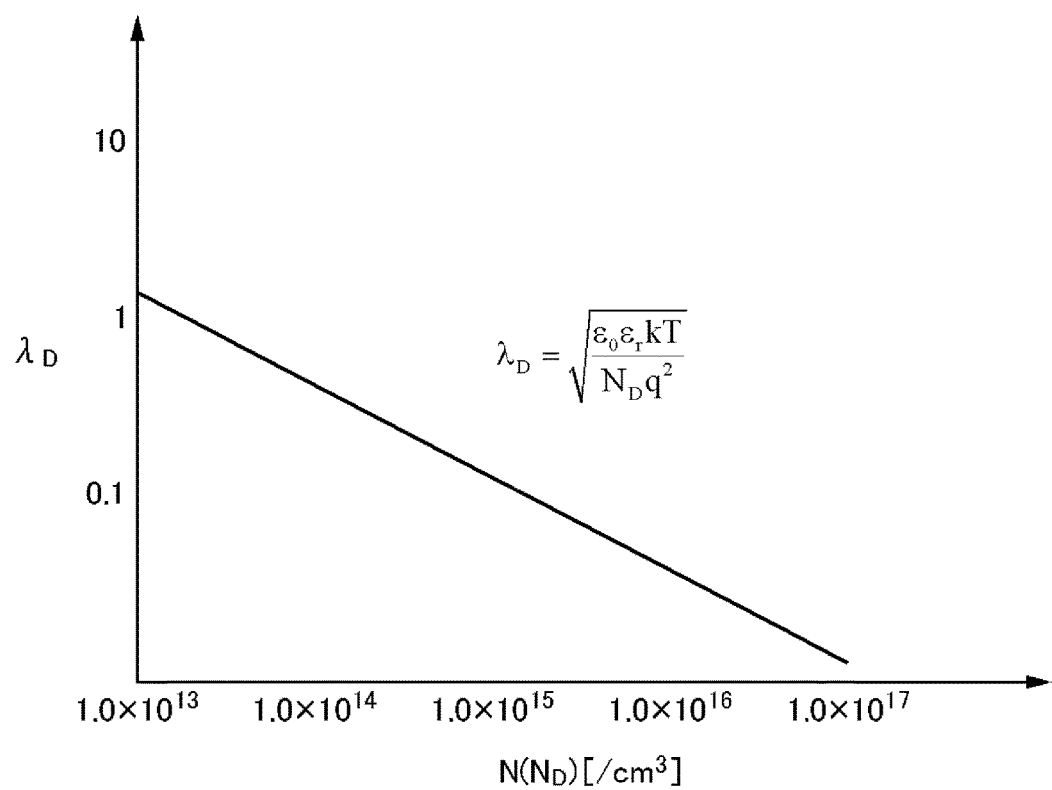
FIG. 9 is a graph showing a Debye length in a back surface of a semiconductor substrate 10.

FIG. 9 is a graph showing the Debye lengths in the back surface of the semiconductor substrate 10. The vertical axis in FIG. 9 shows the Debye lengths (μm), and the horizontal axis shows the concentrations (/cm³) of the first impurities in the back surface of the semiconductor substrate 10. FIG. 9 shows the Debye lengths in the room temperature.

As an example, the concentration of the first impurities in the back surface of the semiconductor substrate 10 is around $1.0 \times 10^{16}$/cm³. In this case, the Debye length is around 0.03 μm. The length of the back surface region 26 in the depth direction may be 0.03 μm or longer. Also, the length of the back surface region 26 may be 0.06 μm or longer, or may be 0.3 μm or longer.

As another example, the concentration of the first impurities in the back surface of the semiconductor substrate 10 is around $1.0 \times 10^{15}$/cm³. In this case, the Debye length is around 0.1 The length of the back surface region 26 in the depth direction may be 0.1 μm or longer. Also, the length of the back surface region 26 may be 0.2 μm or longer, or may be 1 μm or longer.

The back surface region 26 may be shorter than the cathode region 24 in the depth direction of the semiconductor substrate 10. The length of the back surface region 26 may be half of the length of the cathode region 24 or shorter in the depth direction of the semiconductor substrate 10. It may also be one fourth the length of the cathode region 24 or shorter.

Note that the diffusion coefficient of the first impurities inside the semiconductor substrate 10 is preferably greater than that of the second impurities. As an example, the first impurities are protons (hydrogen), and the second impurities are boron. Thus, a distribution where the second impurities are at a higher concentration than the first impurities in the intermediate region 22 and the first impurities are at a higher concentration than the second impurities in the back surface region 26 can be easily formed by diffusing the impurities.

Figure 10A:
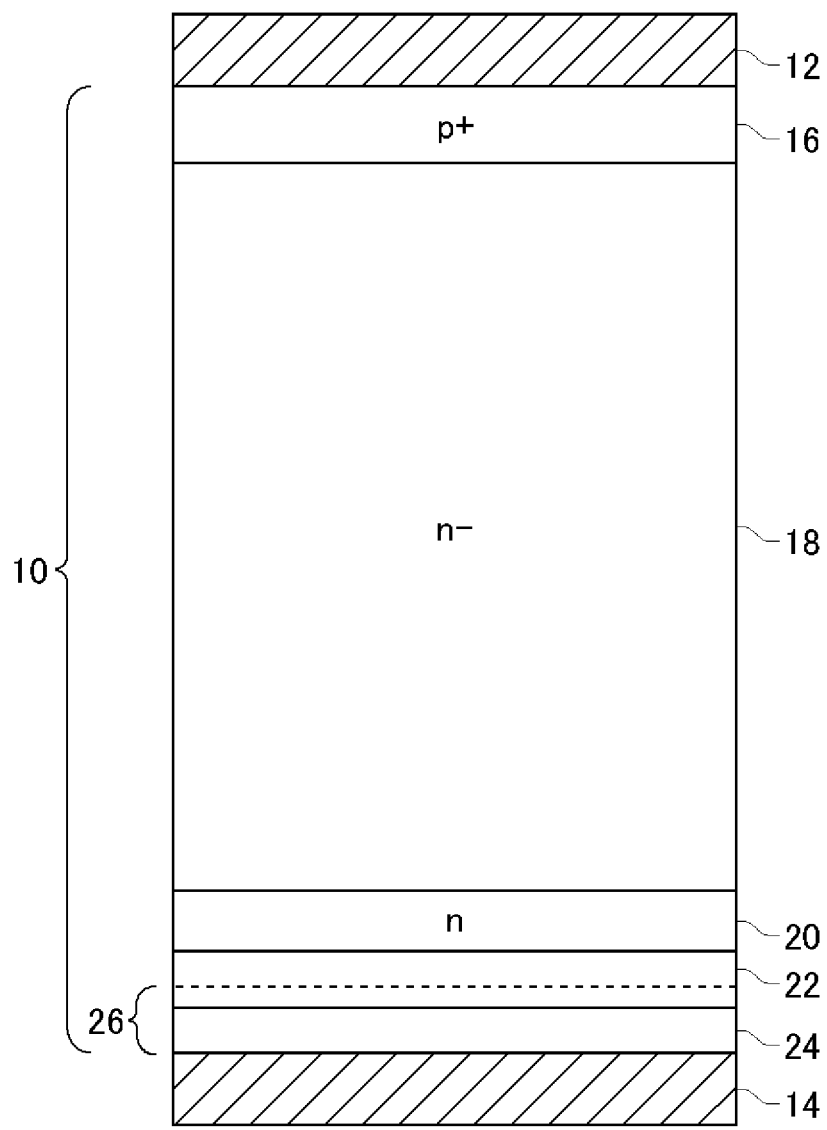
FIG. 10A is a diagram showing another exemplary semiconductor device 100.
Figure 10B:
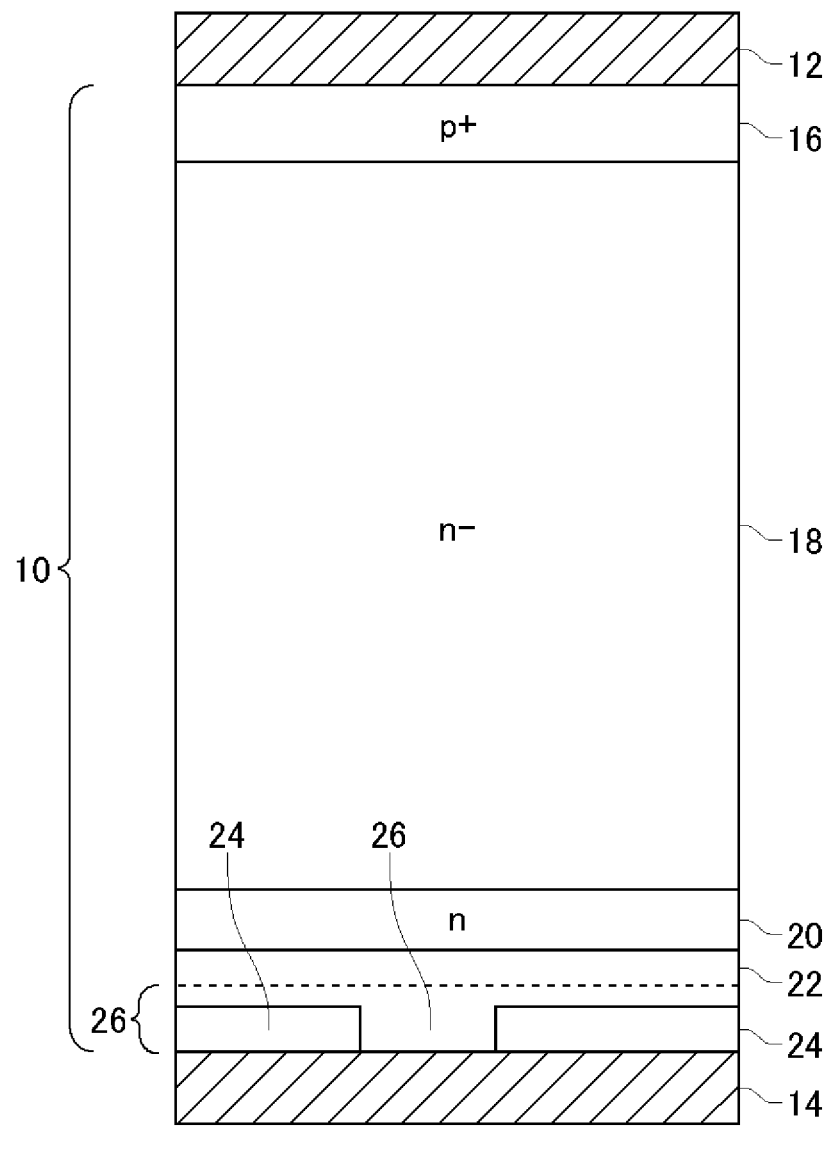
FIG. 10B is a diagram showing the semiconductor device 100 in which part of the cathode region 24 is defective.
Figure 10C:
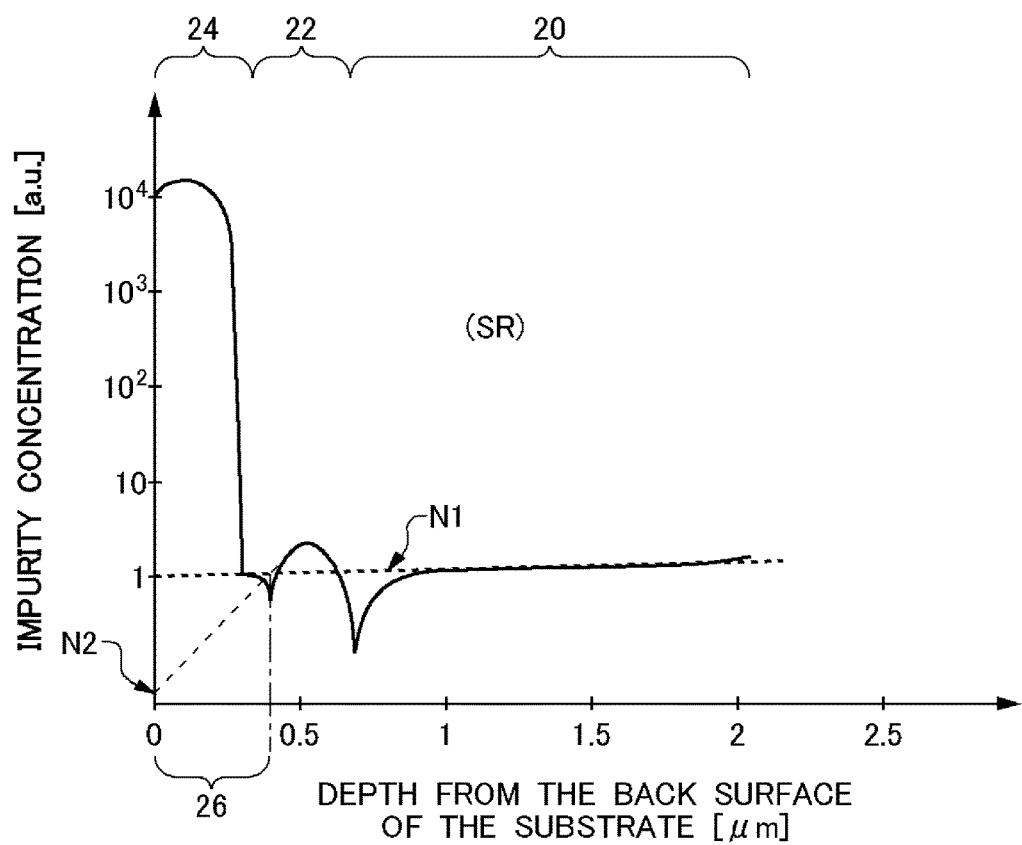
FIG. 10C is a diagram showing an exemplary impurity concentration distribution in the cathode region 24, the intermediate region 22 and the FS region 20.

FIG. 10A is a diagram showing another exemplary semiconductor device 100. FIG. 10B is a diagram showing the semiconductor device 100 in which part of the cathode region 24 is defective. FIG. 10C is a graph showing an exemplary impurity concentration distribution in the cathode region 24, the intermediate region 22, and the FS region 20.

In the semiconductor device 100 of the present example, the back surface region 26 may be longer than the cathode region 24 in the depth direction of the semiconductor substrate 10. That is, the boundary between the p-type intermediate region 22 and the FS region 20 may be at a position deeper than the cathode region 24 in the depth direction of the semiconductor substrate 10. In this case, part of the p-type intermediate region 22 on the back surface side serves as the n-type back surface region 26. This allows the back surface region 26 to be exposed to the back surface of the semiconductor substrate 10 even if a defective part is generated in the cathode region 24 as shown in FIG. 10B.

Also, as shown in FIG. 10C, the back surface region 26 is formed also at an inner position relative to the position where the p-type intermediate region 22 contacts the cathode region 24. Because of this, the p-type intermediate region 22 forms a pn junction with the extended back surface region 26, not with the cathode region 24, on the back surface side. The remaining structure is the same as that of the semiconductor device 100 shown in FIG. 1 through FIG. 9.

In the semiconductor device 100 of the present example, the n-type back surface region 26 is formed between the p-type intermediate region 22 and the n-type cathode region 24, and the concentration in the back surface region 26 is lower than that in the cathode region 24. This allows the avalanche breakdown at the pn junction to relatively gradually occur. Therefore, occurrence of the avalanche current can be controlled during reverse recovery, and therefore, soft recovery characteristic can be adjusted. Also, the effect of suppressing a sharp change (snap-back in a waveform) in the characteristic of voltage-and-current relation in this example is the same as in the semiconductor device 100 shown in FIG. 1 through FIG. 9.

Figure 11:
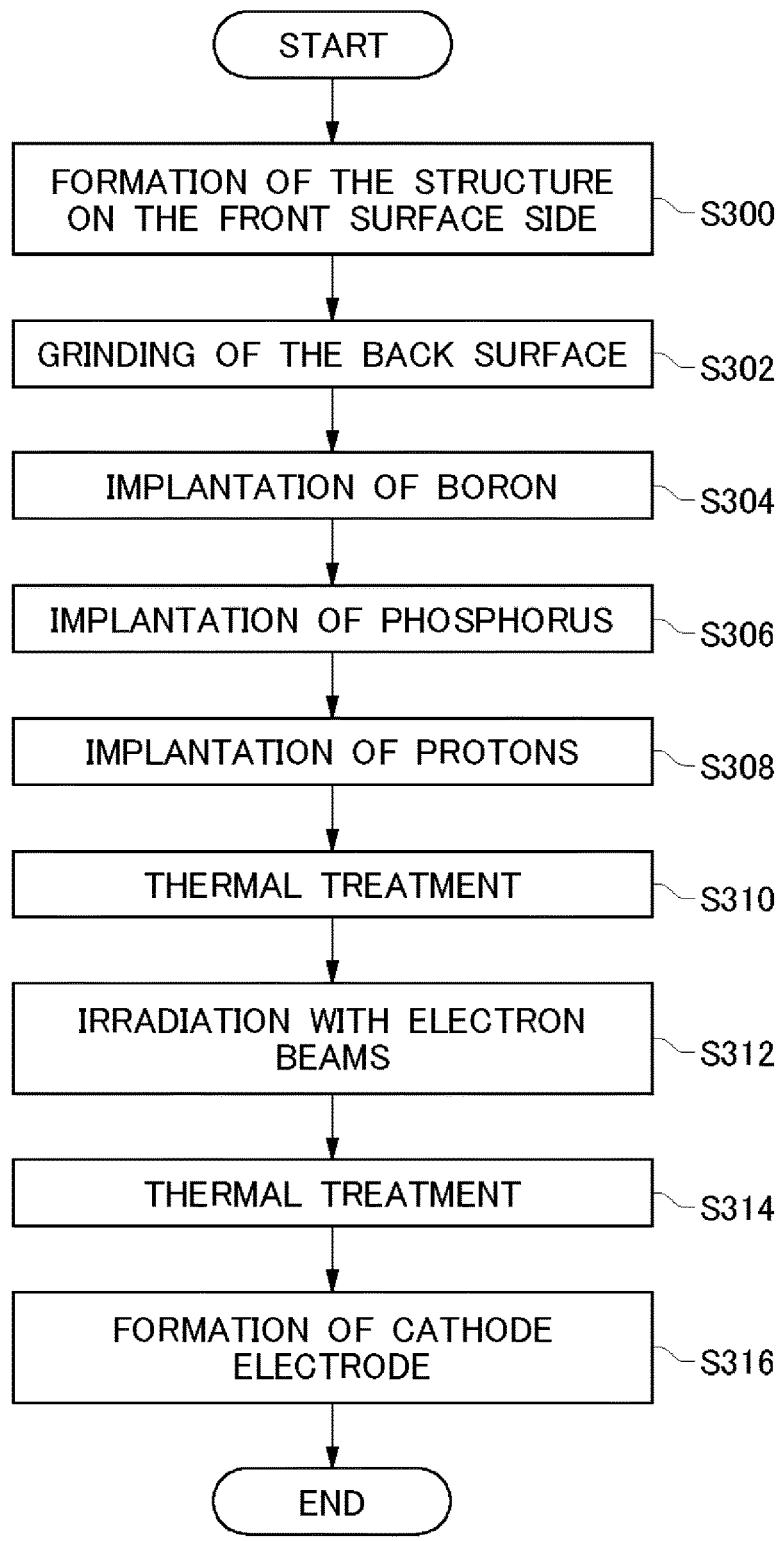
FIG. 11 is a flowchart showing an exemplary process of manufacturing the semiconductor device 100.

FIG. 11 is a flowchart showing an exemplary process of manufacturing the semiconductor device 100. First, on the front surface side of the semiconductor substrate 10, the structure on the front surface side such as the anode region 16 and the anode electrode 12 is formed (S300). As an example, p-type impurities such as boron are implanted and thermally diffused into a predetermined region on the front surface of the semiconductor substrate 10 to form the anode region 16. Then, the anode electrode 12 is formed on the front surface of the semiconductor substrate 10. An insulating film may be provided between the front surface of the semiconductor substrate 10 and the anode electrode 12. The insulating film is provided with a contact hole that electrically connects the anode electrode 12 and the anode region 16.

Then, the back surface of the semiconductor substrate 10 is ground (S302). In S302, the semiconductor substrate 10 is ground to a thickness corresponding to a breakdown voltage that the semiconductor device 100 is expected to have.

Then, the second impurities such as boron are implanted at a position that corresponds to the intermediate region 22 from the back surface side of the semiconductor substrate 10 (S304). Also, the third impurities such as phosphorus are implanted at a position that corresponds to the cathode region 24 from the back surface side of the semiconductor substrate 10 (S306). After the implantation of the second impurities and the third impurities, the second impurities and the third impurities may be activated by laser annealing or the like. Also, the first impurities such as protons (hydrogen) are implanted at a position that corresponds to the FS region 20 from the back surface side of the semiconductor substrate 10 (S308). Other examples of the first impurities include phosphorus and the like.

In the present example, after the third impurities are implanted into the cathode region 24, the first impurities are implanted into the FS region 20. If particles are attached to the back surface of the semiconductor substrate 10 in the step of implanting the third impurities into the cathode region 24, it is highly possibility that the particles are detached in the step of implanting the third impurities, laser annealing, and the like. Because of this, implanting the first impurities after the third impurities are implanted makes it easier to form the back surface region 26 with no defective parts even if a defective part is generated in the cathode region 24.

Then, the semiconductor substrate 10 is transferred to an annealing furnace or the like and thermally treated (S310). In a case where the first impurities are protons (hydrogen), the temperature of the thermal treatment is around 350° C. Also, in a case where the first impurities are phosphorus ions, the temperature of the thermal treatment is around 450° C.

This activates and slightly diffuses the first impurities such as protons (hydrogen) or the like. In the steps S304 through S310, the FS region 20, the intermediate region 22, and the cathode region 24 are formed. In these steps, the first impurities and the second impurities are respectively implanted and diffused such that the concentration of the first impurities becomes higher than the concentration of the second impurities in the back surface of the semiconductor substrate 10.

For example, by adjusting the depth where the second impurities such as boron are implanted, the magnitude relation between the first impurities and the second impurities in the back surface of the semiconductor substrate 10 can be adjusted. As the second impurities are implanted more deeply, the second impurities that are diffused to reach the back surface of the semiconductor substrate 10 decrease. In a case where boron is implanted as the second impurities, it may be implanted at a position 0.4 μm or more deeper from the back surface of the semiconductor substrate 10. That is, the position of the peak concentration of the second impurities may be a position 0.4 μm or more deeper from the back surface of the semiconductor substrate 10.

Furthermore, also by setting the peak concentration of the first impurities to be relatively high, the magnitude relation between the first impurities and the second impurities in the back surface of the semiconductor substrate 10 can be adjusted. The peak concentration of the first impurities may be one hundredth the peak concentration of the second impurities or higher. The peak concentration of the first impurities may be one thirtieth the peak concentration of the second impurities or higher. Note that in a case where there are a plurality of peak concentrations of the first impurities, a peak concentration of the first impurities, the peak concentration closest to the back surface of the semiconductor substrate 10, may be half of the peak concentration of the second impurities or higher.

Furthermore, by setting the peak position of the first impurities to be shallow, the magnitude relation between the first impurities and the second impurities in the back surface of the semiconductor substrate 10 can be adjusted. As the first impurities are implanted more shallowly, the first impurities that are diffused to reach the back surface of the semiconductor substrate 10 increase. In a case where protons are used as the first impurities, the peak in the concentration distribution of the first impurities may be provided in an area ranging from 2 μm to 10 μm from the back surface of the semiconductor substrate 10. The upper limit of the peak position may also be 5 μm or shorter. In a case where there are a plurality of peak concentrations of the first impurities, a peak concentration of the first impurities, the peak concentration closest to the back surface of the semiconductor substrate 10, may be provided in the range.

Note that the first impurities are implanted at a position deeper than the third impurities and diffused on the back surface side of the semiconductor substrate 10. Because of this, the first impurities can be easily diffused to reach the region covered with particles in the back surface of the semiconductor substrate 10. Because of this, even if the cathode region 24 is partially defective, the back surface region 26 with no defective parts can be formed.

Note that the diffusion coefficient of the first impurities is preferably greater than that of the second impurities. Because of this, even in a case where particles are attached to the back surface of the semiconductor substrate 10 during implantation of the first impurities, the first impurities are diffused to reach the region covered with particles, which makes it easier to form the back surface region 26 with no defective parts.

Then, the semiconductor substrate 10 is irradiated with electron beams or the like (S312). Also, the semiconductor substrate 10 is thermally treated (S314). This adjusts the carrier lifetimes inside the semiconductor substrate 10.

Then, the cathode electrode 14 is formed on the back surface of the semiconductor substrate 10 (S316). Through such steps, the semiconductor device 100 can be manufactured.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

EXPLANATION OF REFERENCE NUMERALS

10: semiconductor substrate; 12: anode electrode; 14: cathode electrode; 16: anode region; 18: drift region; 20: FS region; 22: intermediate region; 24: cathode region; 26: back surface region; 100: semiconductor device; 200: semiconductor device

What is claimed is:

1. A semiconductor device comprising a semiconductor substrate, the semiconductor substrate comprising:
   a field stop region where first impurities of a first conduction type are implanted;
   an intermediate region that is formed on a back surface side of the field stop region and where second impurities of a second conduction type are implanted;
   a cathode region of the first conduction type that is formed on a back surface side of the intermediate region; and
   a back surface region where a concentration of the first impurities is higher than a concentration of the second impurities is formed in a depth direction from the back surface of the semiconductor substrate, wherein
   in a back surface of the semiconductor substrate, the concentration of the first impurities is higher than the concentration of the second impurities, and
   the length of the back surface region in the depth direction is longer than a Debye length in the back surface of the semiconductor substrate.

2. The semiconductor device according to claim 1, wherein in the back surface of the semiconductor substrate, the concentration of the first impurities is 5 times the concentration of the second impurities or higher.

3. The semiconductor device according to claim 1, wherein third impurities are implanted in the cathode region, and
   in the back surface of the semiconductor substrate, the concentration of the first impurities is one thousandth a concentration of the third impurities or lower.

4. The semiconductor device according to claim 1, wherein the length of the back surface region in the depth direction is 0.03 µm or longer.

5. The semiconductor device according to claim 1, wherein the back surface region is shorter than the cathode region in the depth direction.

6. The semiconductor device according to claim 1, wherein the back surface region is longer than the cathode region in the depth direction.

7. The semiconductor device according to claim 1, wherein in the back surface region, a difference between the concentration of the first impurities and the concentration of the second impurities increases in a region closer to the back surface of the semiconductor substrate.

8. A semiconductor device comprising a semiconductor substrate, the semiconductor substrate comprising:
   a field stop region where first impurities of a first conduction type are implanted;
   an intermediate region that is formed on a back surface side of the field stop region and where second impurities of a second conduction type are implanted; and
   a cathode region of the first conduction type that is formed on a back surface side of the intermediate region, wherein
   in a back surface of the semiconductor substrate, a concentration of the first impurities is higher than a concentration of the second impurities,
   a back surface region where the concentration of the first impurities is higher than the concentration of the second impurities is formed in a depth direction from the back surface of the semiconductor substrate, and
   a length of the back surface region in the depth direction is a length through which a hole does not tunnel.

9. The semiconductor device according to claim 8, wherein the length of the back surface region in the depth direction is longer than a Debye length in the back surface of the semiconductor substrate.

10. The semiconductor device according to claim 9, wherein the length of the back surface region in the depth direction is 0.03 µm or longer.

11. The semiconductor device according to claim 8, wherein the back surface region is shorter than the cathode region in the depth direction.

12. The semiconductor device according to claim 8, wherein the back surface region is longer than the cathode region in the depth direction.

13. The semiconductor device according to claim 8, wherein in the back surface region, a difference between the concentration of the first impurities and the concentration of the second impurities increases in a region closer to the back surface of the semiconductor substrate.

14. A semiconductor device manufacturing method, the method comprises: in a semiconductor substrate,
   forming a field stop region where first impurities of a first conduction type are implanted;
   forming an intermediate region that is formed on a back surface side of the field stop region and where second impurities of a second conduction type are implanted; and
   forming a cathode region of the first conduction type that is formed on a back surface side of the intermediate region; and
   forming a back surface region where a concentration of the first impurities is higher than a concentration of the second impurities in a depth direction from the back surface of the semiconductor substrate, wherein
   in a back surface of the semiconductor substrate, the first impurities and the second impurities are implanted such that a concentration of the first impurities becomes higher than a concentration of the second impurities, and
   the length of the back surface region in the depth direction is longer than a Debye length in the back surface of the semiconductor substrate.

15. The manufacturing method according to claim 14, wherein impurities are implanted into the field stop region after impurities are implanted into the cathode region.

* * * * *